United States Patent
Hsieh et al.

(10) Patent No.: US 9,500,687 B2
(45) Date of Patent: Nov. 22, 2016

(54) CIRCUIT AND METHOD FOR MEASURING THE GAIN OF AN OPERATIONAL AMPLIFIER

(71) Applicant: TAIWAN SEMICONDUCTOR MANUFACTURING COMPANY LTD., Hsinchu (TW)

(72) Inventors: Chung-Peng Hsieh, New Taipei (TW); Yung-Chow Peng, Hsinchu (TW); Chung-Chieh Yang, Hsinchu County (TW); Chung-Ting Lu, Kaohsiung (TW); Chih-Chiang Chang, Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 1 day.

(21) Appl. No.: 14/222,240

(22) Filed: Mar. 21, 2014

(65) Prior Publication Data
US 2015/0268297 A1    Sep. 24, 2015

(51) Int. Cl.
*H03F 3/45*    (2006.01)
*G01R 27/28*    (2006.01)

(52) U.S. Cl.
CPC ........... *G01R 27/28* (2013.01); *H03F 3/45475* (2013.01); *H03F 2200/261* (2013.01); *H03F 2200/411* (2013.01); *H03F 2203/45138* (2013.01); *H03F 2203/45528* (2013.01); *H03F 2203/45594* (2013.01)

(58) Field of Classification Search
CPC ........................................................ H03F 3/45
USPC ............................................. 330/2, 252, 69
See application file for complete search history.

(56) References Cited

U.S. PATENT DOCUMENTS

| | | | |
|---|---|---|---|
| 3,623,140 A * | 11/1971 | Nercessian | 323/268 |
| 5,886,580 A * | 3/1999 | Ikeda et al. | 330/293 |
| 6,081,157 A * | 6/2000 | Ikeda et al. | 330/107 |
| 2008/0197924 A1 * | 8/2008 | Oishi | 330/144 |
| 2013/0135047 A1 * | 5/2013 | Danioni | 330/252 |
| 2013/0229231 A1 * | 9/2013 | Tanaka et al. | 330/254 |

* cited by examiner

*Primary Examiner* — Henry Choe
(74) *Attorney, Agent, or Firm* — WPAT, P.C., Intellectual Property Attorneys; Anthony King

(57) ABSTRACT

A circuit for measuring the gain of an operational amplifier is provided. The circuit comprises a first operational amplifier, a first resistive device and a second resistive device. The first operational amplifier has an original gain and includes a first input terminal and a second input terminal. The first resistive device is coupled between the first input terminal and the second input terminal of the first operational amplifier. The second resistive device is coupled to the second input terminal of the first operational amplifier. The first resistive device and the second resistive device are configured to reduce a predetermined amount of gain from the original gain of the first operational amplifier.

13 Claims, 7 Drawing Sheets

CIRCUIT AND METHOD FOR MEASURING THE GAIN OF AN OPERATIONAL AMPLIFIER

BACKGROUND

Operational amplifiers have been widely used to amplify signals. As a high-gain electronic device, an operational amplifier generates an output voltage that is typically hundreds of or thousands of times larger than the potential difference between its input terminals. Gain is an important factor to determine the performance of an operational amplifier. With steady progress in semiconductor manufacturing, higher density, higher functionality, and higher speed of semiconductor integrated circuit devices have been developed. For example, in advanced semiconductor integrated circuits, gain of an operational amplifier may be greater than 60 dB. Testing tools are required to measure such high-gain operational amplifiers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
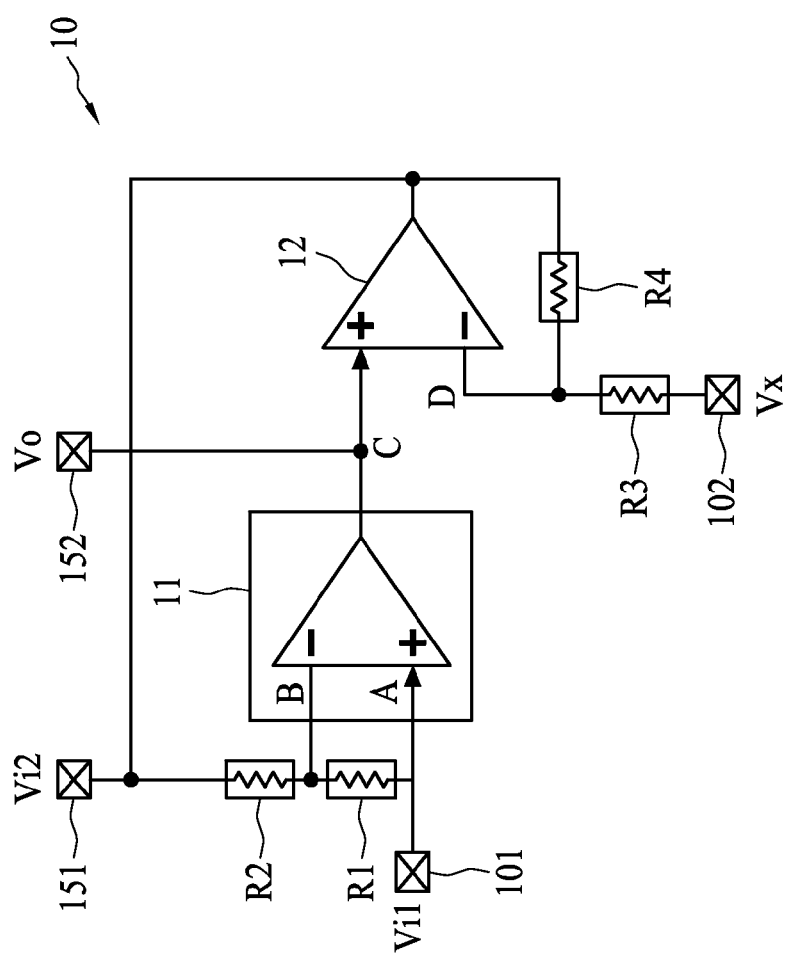
FIG. 1 is a diagram of a circuit for testing an operational amplifier, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

It will be understood that when an element is referred to as being "connected to" or "coupled to" another element, it may be directly connected to or coupled to the other element, or intervening elements may be present.

FIG. 1 is a diagram of a circuit 10 for testing an operational amplifier, in accordance with some embodiments. Referring to FIG. 1, circuit 10 includes a first operational amplifier 11, a second operational amplifier 12, a first resistive device R1 and a second resistive device R2. First operational amplifier 11 is a device under test, while second operation amplifier 12 is configured to establish a voltage at an output terminal of first operational amplifier 11.

First operational amplifier 11 includes a first input terminal A, a second input terminal B and an output terminal C. In some embodiments, first input terminal A is a non-inverting terminal, while second input terminal B is an inverting terminal. First input terminal A is configured to receive a first input voltage Vi1 at a first input pad 101. First resistive device R1 is coupled between first input terminal A and second input terminal B. As a result, the differential input voltage (ΔVi) between first input terminal A and second input terminal B of first operational amplifier 11 can be determined by the voltage across first resistive device R1.

Second input terminal B of first operational amplifier 11 is coupled, via second resistive device R2, to a first test pad 151 and an output terminal of second operational amplifier 12. In some embodiments, first resistive device R1 and second resistive device R2 include resistors having resistances of R1 and R2, respectively. Given ΔVi being the voltage across first resistive device R1, the voltage across second resistive device R2 is $$\Delta Vi \times \left(\frac{R2}{R1}\right).$$

Accordingly, the voltage level Vi2 at the first test pad can be expressed in Equation 1 below.

$$Vi2 = Vi1 + \Delta Vi + \Delta Vi \times \left(\frac{R2}{R1}\right) = Vi1 + \Delta Vi \times \left(\frac{R2}{R1} + 1\right) \qquad \text{Equation 1}$$

Output terminal C of first operational amplifier 11 is coupled to a second test pad 152 and a non-inverting terminal of second operational amplifier 12. Gain of first operational amplifier 11, denoted as G, is defined by a differential equation below.

$$G = \frac{dVo}{dVi2}(V/V) \qquad \text{Equation 2}$$

where Vo is a voltage level at second test pad 152 while dVo represents the differential voltage of Vo, and dVi2 represents the differential voltage of Vi2.

Second operational amplifier 12 includes a first input terminal C, a second input terminal D and an output terminal. In some embodiments, first input terminal C is a non-inverting terminal, while second input terminal D is an inverting terminal. First input terminal C is coupled to the output terminal of first operational amplifier 11 and to second test pad 152. Second input terminal D is configured to receive a second input voltage Vx at a second input pad 102 via a third resistive device R3. Moreover, second input terminal D is coupled to the output terminal of second operational amplifier 12 via a fourth resistive device R4. In an embodiment, third resistive device R3 and fourth resistive device R4 include resistors having resistances of R3 and R4, respectively. In another embodiment, third and fourth resistive devices R3 and R4 have the same resistance.

To measure the gain of first operational amplifier 11, as expressed in the above Equation 2, differential changes in Vo at second test pad 152 and in Vi2 at first test pad 151 should be obtained. In operation, first input voltage Vi1 of a predetermined voltage level is applied to first input pad 101. In some embodiments, the predetermined voltage level is approximately 0.5 volt (V) and is maintained unchanged during the measuring period. As will be clear from the following discussion, first input voltage Vi1 serves as a basis to establish differential values of Vi2 at first test pad 151 and Vo at second test pad 152.

Next, second input voltage Vx, which is subject to change, is applied to second input pad 102. In some embodiments, second input voltage Vx of a first voltage level is first applied to second input pad 102, and then voltage outputs at first test pad 151 and second test pad 152 are measured. Further, second input voltage Vx of a second voltage level different from the first voltage level is then applied to second input pad 102, and subsequently voltage outputs at first test pad 151 and second test pad 152 are measured. In some embodiments, the first and second voltage levels of second input voltage Vx applied are approximately 0.3V and 0.5V, respectively.

Since the voltage level of first input voltage Vi1 is kept unchanged, the differential voltage of Vi2, dVi2, is totally contributed by $$\Delta Vi \times \left(\frac{R2}{R1} + 1\right),$$

as can be derived from Equation 1. The gain of first operational amplifier 11 can be further expressed in Equation 3 as follows.

$$G = \frac{dVo}{dVi2} = \frac{dVo}{dVi \times \left(\frac{R2}{R1} + 1\right)} (V/V) \quad \text{Equation 3}$$

In some embodiments, to facilitate calculation, the ratio of $$\frac{R2}{R1}$$

is a positive integer N. Accordingly, Equation 3 can be rewritten as Equation 4 below.

$$G = \frac{dVo}{dVi2} = \frac{dVo}{dVi \times \left(\frac{R2}{R1} + 1\right)} = \frac{dVo}{dVi \times (N+1)} (V/V) \quad \text{Equation 4}$$

By expressing the gain of first operational amplifier 11 in decibel (dB), Equation 5 is obtained.

$$G = 20 \log \frac{dVo}{dVi \times (N+1)} = 20 \log \frac{dVo}{dVi} - 20 \log(N+1) (dB) \quad \text{Equation 5}$$

In Equation 5, the first portion, $$20 \log \frac{dVo}{dVi},$$

can be deemed as the original gain of first operational amplifier 11 free from first and second resistive devices R1 and R2. The second portion, −20 log (N+1), contributes to lower the original gain of first operational amplifier 11 and thus facilitates measurement of the original gain when voltage resolution of a tester becomes critical. For example, if a tester has a maximum gain reading of 60 dB due to voltage resolution while the gain of a device under test (DUT) is 70 dB, since the gain of the DUT exceeds the tester's gauge, in some existing approaches the gain of the DUT as measured by the tester is 60 dB rather than 70 dB. With the first and second resistive devices R1 and R2 according to the present disclosure, if N=9, a gain measured is 20 dB lower than the original gain. Consequently, in the case of a 60 dB resolution, according to the present disclosure, the measured gain of the DUT having an original gain of 70 dB is 50 dB (70 dB minus 20 dB), which falls within the tester's resolution and thus can be measured without error. The original gain of the DUT can subsequently be obtained by adding back the reduced gain (20 dB) to the measured gain (50 dB). The limitation in gain measurement due to voltage resolution of a tester is discussed in more detail below with reference to FIG. 2.

Figure 2:
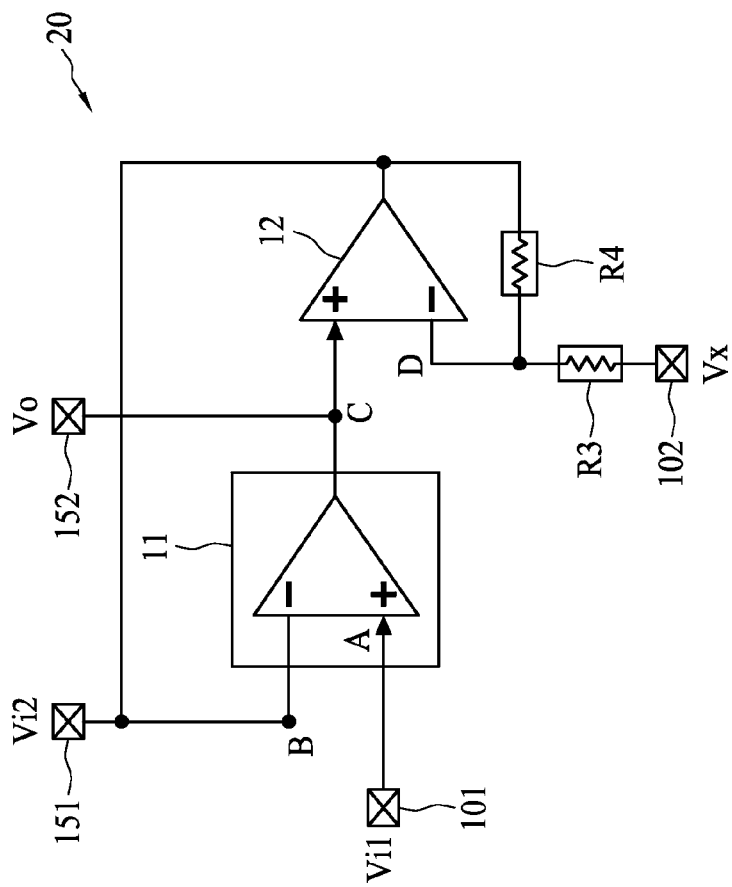
FIG. 2 is a diagram of an exemplary circuit for explaining limitation in gain measurement.

FIG. 2 is a diagram of an exemplary circuit 20 for explaining limitation in gain measurement. Referring to FIG. 2, circuit 20 is similar to circuit 10 described and illustrated with reference to FIG. 1 except that, for example, resistive devices R1 and R2 are removed. To measure the gain of first operational amplifier 11, as previously discussed, first input voltage Vi1 is kept at, for example, 0.5V and second input voltage Vx is changed from 0.3V for a first output measurement to 0.5V for a second output measurement. Accordingly, the gain of first operational amplifier 11 can be obtained by Equation 6 as follows.

$$G = \frac{\Delta Vo}{\Delta Vi2} = \frac{Vo(Vx = 0.5 \text{ V}) - Vo(Vx = 0.3 \text{ V})}{Vi2(Vx = 0.5 \text{ V}) - Vi2(Vx = 0.3 \text{ V})} (V/V) \quad \text{Equation 6}$$

where Vo (Vx=0.5V) represents a voltage level obtained at second test pad 152 when second input voltage Vx is 0.5V, Vo (Vx=0.3V) represents a voltage level obtained at second test pad 152 when second input voltage Vx is 0.3V, Vi2 (Vx=0.5V) represents a voltage level obtained at first test pad 151 when second input voltage Vx is 0.5V, and Vi2 (Vx=0.3V) represents a voltage level obtained at first test pad 151 when second input voltage Vx is 0.3V.

Given that Vi1 of 0.5V is applied to first input pad 101, terminal A of first operational amplifier 11 is 0.5V. Terminal B of first operation amplifier 11, due to "virtual short" existing between the two input terminals, is also 0.5V. Hence Vi2 at first test pad 151 and the output of second operational amplifier 12 are 0.5V. Further, given that Vx of 0.3V is applied to second input pad 102 and resistive devices R3 and R4 have the same resistance, by function of voltage division between resistive devices R3 and R4, terminal D of second operational amplifier 12 is 0.4V because resistive devices R3 and R4 equally shared the voltage drop of 0.2V between the output of second operational amplifier 12 and second input pad 102. Terminal C of second operational amplifier 12 is thus 0.4V due to virtual short existing between the two terminals. Accordingly, a first measure result, Vo=0.4V and Vi2=0.5V (when Vx=0.3V), is obtained.

Next, second input voltage Vx is changed to 0.5V and first input voltage Vi1 is kept at 0.5V. Due to virtual short, Vi2 at first test pad 151 and hence the output of second operational amplifier 12 are 0.5V. Since there is no voltage drop between the output of second operational amplifier 12 and second input pad 102, terminal D of second operational amplifier 12 is 0.5V. Terminal C of second operational amplifier 12 is thus 0.5V due to virtual short existing between terminals C and D. Accordingly, a second measure result, Vo=0.5V and Vi2=0.5V (when Vx=0.5V), is obtained.

Referring back to Equation 6, by substituting the values of Vo obtained from the first and second measurement results, ΔVo is determined. As to ΔVi2, since first operational amplifier 11 is not an ideal operational amplifier, a relatively small difference may actually exist between the first and second measurement results. Nevertheless, the difference may be too small to be detected due to the limitation in voltage resolution. In some existing approaches, the voltage resolution of a tester is approximately 0.1 millivolt (mV). In that case, the maximum gain (Gmax) such testers can measure is calculated below.

$$Gmax = \frac{\Delta Vo}{\Delta Vi2} = \frac{0.5\ V - 0.4\ V}{0.1\ mV} = \frac{100\ mV}{0.1\ mV} = 1000, \text{ or}$$

$$Gmax = 20\ \log(1000) = 60\ dB$$

As a result, the gain of first operational amplifier 11 in circuit 20, if greater than 60 dB, may not be correctly measured. By comparison, circuit 10 illustrated in FIG. 1 according to the present disclosure provides a reliable way of gain measurement based on Equation 5. Referring again to Equation 5, the value of N can be predetermined to measure operational amplifiers having different gains that would otherwise be not measurable by existing approaches. In an embodiment, (N+1) is set to be 10, and an additional room of 20 dB is allowed for measuring the gain of first operational amplifier 11. Given a tester having a voltage resolution of 0.1 mV and thus a maximum gain reading of 60 dB, the tester is now able to measure first operational amplifier 11 having an original gain of up to 80 dB. In another embodiment, (N+1) is set to be 32, and an additional room of 30 dB is allowed for measuring the gain of first operational amplifier 11. Given the same tester conditions, the tester is now able to measure first operational amplifier 11 having an original gain of up to 90 dB. In yet another embodiment, (N+1) is set to be 100, and an additional room of 40 dB is allowed for measuring the gain of first operational amplifier 11. Given the same tester conditions, the tester is now able to measure first operational amplifier 11 having an original gain of up to 100 dB.

Figure 3:
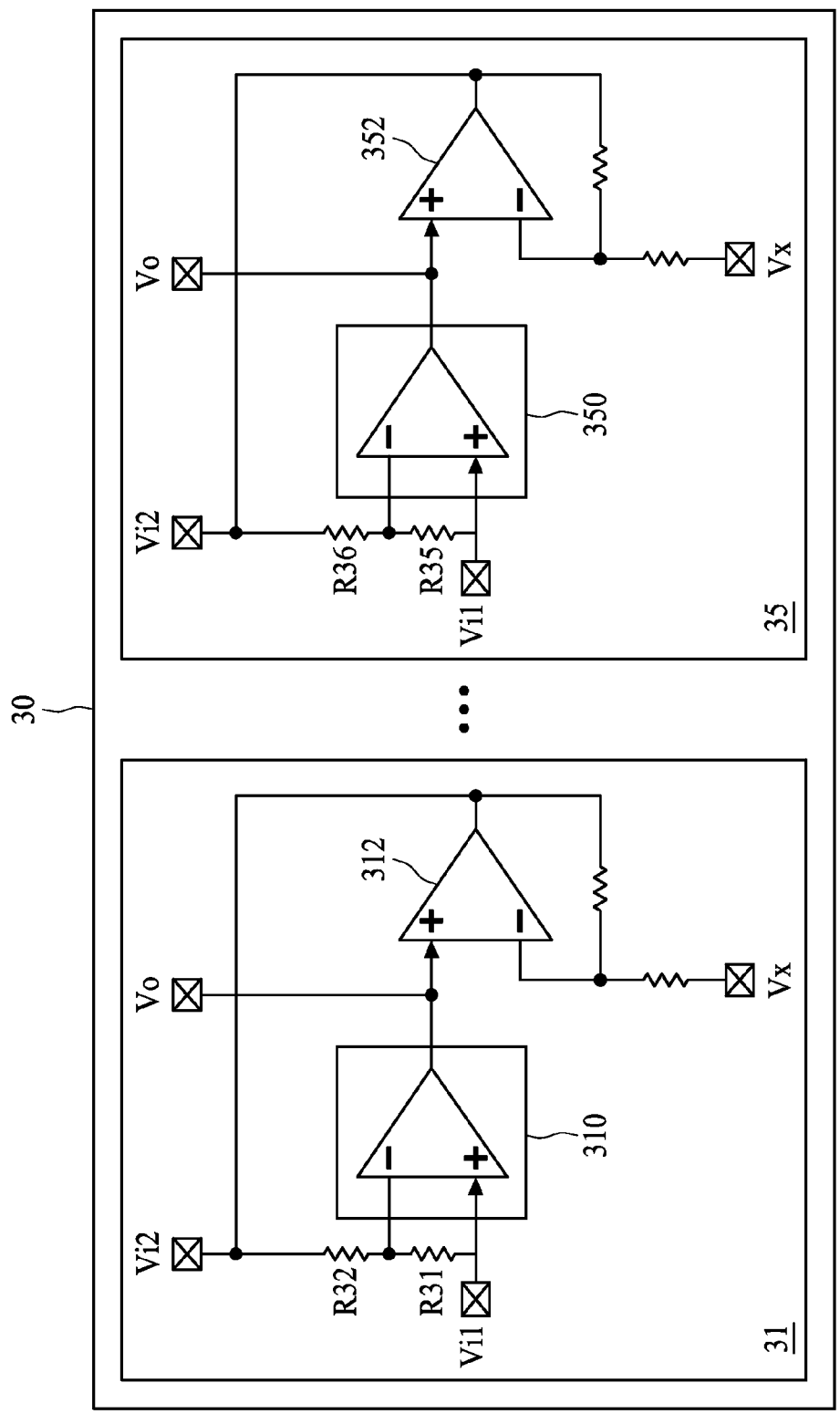
FIG. 3 is a diagram of a test structure for testing operational amplifiers in an unpackaged semiconductor wafer, in accordance with some embodiments.

FIG. 3 is a diagram of a test structure 30 for testing operational amplifiers in an unpackaged semiconductor wafer, in accordance with some embodiments. Referring to FIG. 3, test structure 30 includes circuits 31 and 35 for testing the gains of first operational amplifiers 310 and 350, respectively. Each of circuits 31 and 35 is similar to circuit 10 described and illustrated with reference to FIG. 1. Although only two circuits 31 and 35 are shown, circuit structure 30 that includes three or more testing circuits like circuit 10 falls within the contemplated scope of the present disclosure.

Circuit 31 includes first operational amplifier 310 as a circuit under test and a second operational amplifier 312 to facilitate gain measurement of first operational amplifier 310. A first resistive device R31 is connected between a first input terminal and a second input terminal of first operational amplifier 310. Moreover, a second resistive device R32 is connected between the second input terminal of first operational amplifier 310 and an output of second operational amplifier 312. In circuit 31, the measured gain G310 of first operational amplifier 310 is expressed in an equation below.

$$G310 = 20\ \log\frac{dVo}{dVi} - 20\ \log\left(\frac{R32}{R31} + 1\right)(dB)$$

Circuit 35 includes first operational amplifier 350 as a circuit under test and a second operational amplifier 352 to facilitate gain measurement of first operational amplifier 350. A first resistive device R35 is connected between a first input terminal and a second input terminal of first operational amplifier 350. Moreover, a second resistive device R36 is connected between the second input terminal of first operational amplifier 350 and an output of second operational amplifier 352. Similarly, in circuit 35, the measured gain G350 of first operational amplifier 350 is expressed in an equation below.

$$G350 = 20\ \log\frac{dVo}{dVi} - 20\ \log\left(\frac{R36}{R35} + 1\right)(dB)$$

In some embodiments, the ratio of $$\left(\frac{R32}{R31}\right)$$

in circuit 31 is substantially equal to that of $$\left(\frac{R36}{R35}\right)$$

in circuit 35, which facilitates the fabrication of circuits 31 and 35 on the semiconductor wafer. In other embodiments, the ratio of $$\left(\frac{R32}{R31}\right)$$

in circuit 31 is different from that of $$\left(\frac{R36}{R35}\right)$$

in circuit 35, which facilitates gain measurement of first operational amplifiers 310 and 350 having different gains.

Figure 4A:
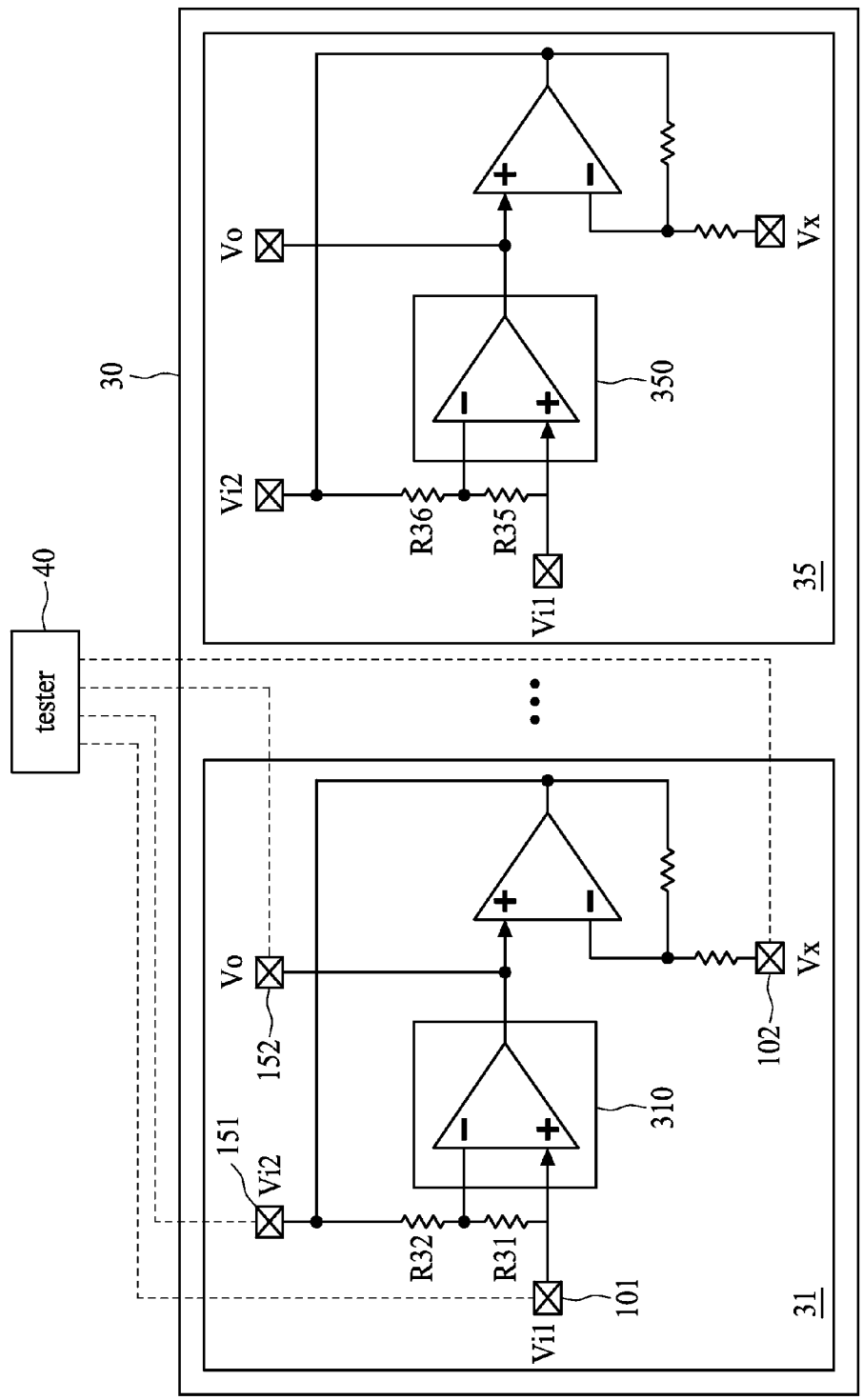
FIGS. 4A and 4B are schematic diagrams illustrating a method of testing operational amplifiers in an unpackaged semiconductor wafer, in accordance with some embodiments.
Figure 4B:
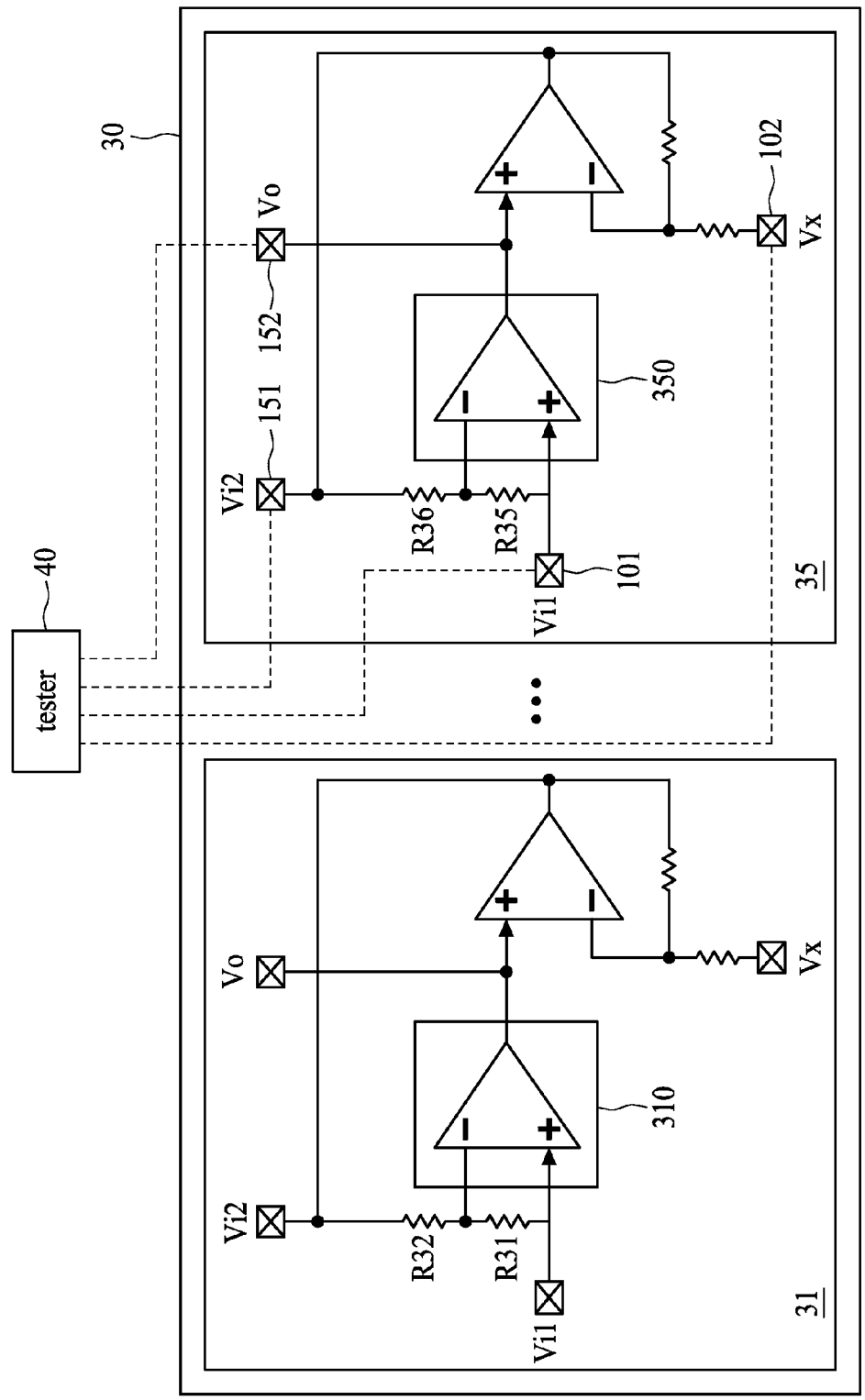

FIGS. 4A and 4B are schematic diagrams illustrating a method of testing operational amplifiers in an unpackaged semiconductor wafer, in accordance with some embodiments. Referring to FIG. 4A, first input pad 101, second input pad 102, first test pad 151 and second test pad 152 associated with circuit 31 are coupled to a tester 40. By providing suitable voltages to first and second input pads 101 and 102, a combined gain of first operational amplifier 310 in circuit 31 can be obtained. Subsequently, by adding the combined gain and a reduced gain of $$20 \log\left(\frac{R32}{R31} + 1\right) dB,$$

the original gain of first operational amplifier 310 in circuit 31 is determined.

Referring to FIG. 4B, first input pad 101, second input pad 102, first test pad 151 and second test pad 152 associated with circuit 35 are coupled to tester 40. By providing suitable voltages to first and second input pads 101 and 102, a combined gain of first operational amplifier 350 in circuit 35 can be obtained. Subsequently, by adding the combined gain and a reduced gain of $$20 \log\left(\frac{R36}{R35} + 1\right) dB,$$

the original gain of first operational amplifier 350 in circuit 35 is determined.

Likewise, the original gains of first operational amplifiers in other circuits of the semiconductor wafer, if any, can be determined in a similar fashion.

Figure 5:
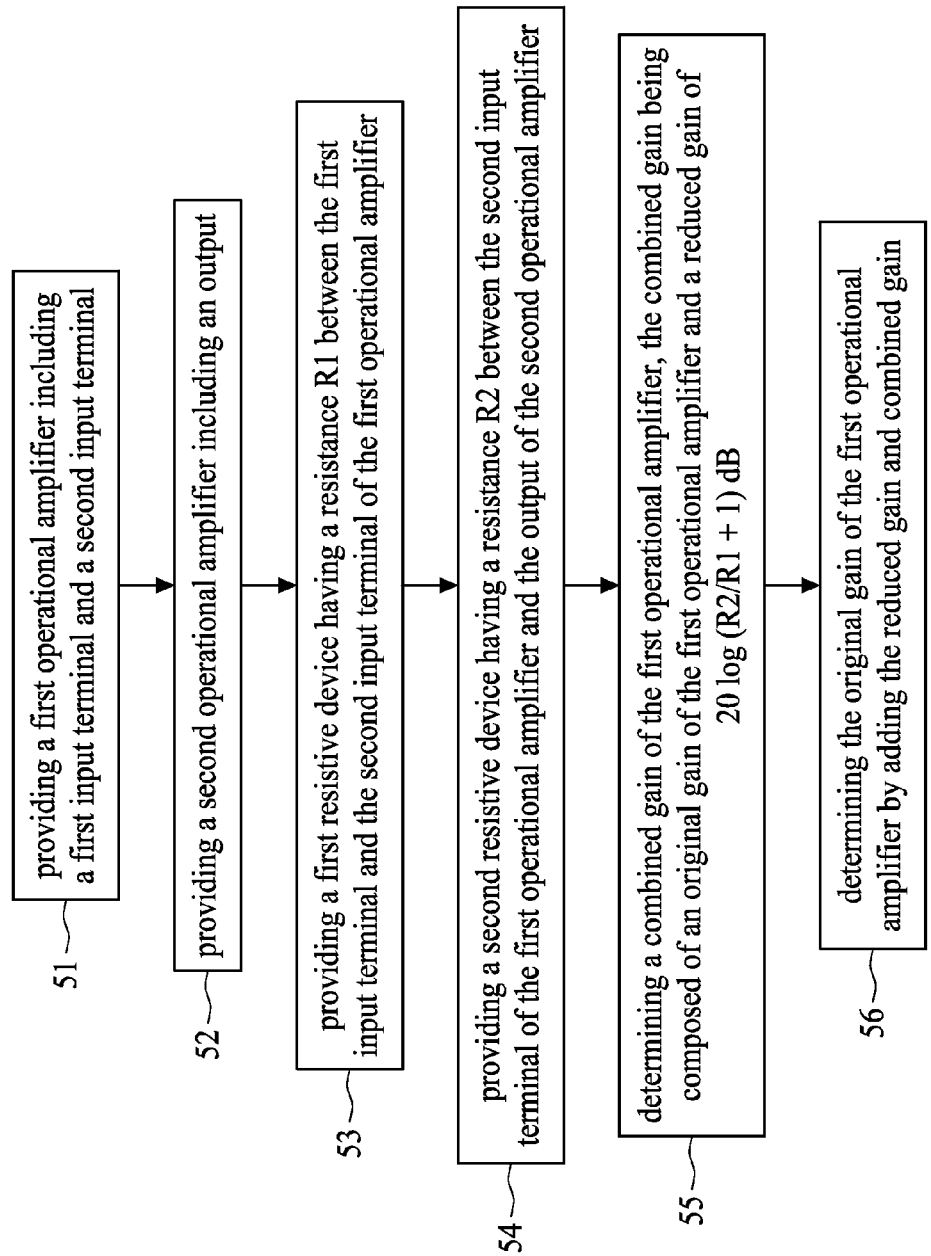
FIG. 5 is a flow diagram illustrating a method of measuring the gain of an operational amplifier, in accordance with some embodiments.

FIG. 5 is a flow diagram illustrating a method of measuring the gain of an operational amplifier, in accordance with some embodiments. Referring to FIG. 5, in operation 51, a first operational amplifier including a first input terminal and a second input terminal is provided. In some embodiments, the first input terminal is a non-inverting input of the first operational amplifier while the second input terminal is an inverting input of the first operational amplifier.

In operation 52, a second operational amplifier is provided. The second operational amplifier includes a first input terminal coupled to an output of the first operational amplifier, a second input terminal coupled to a tap of a voltage division circuit, and an output coupled to the voltage division circuit. In some embodiments, the first input terminal is a non-inverting input of the second operational amplifier while the second input terminal is an inverting input of the second operational amplifier. In some embodiments, the voltage division circuit includes two resistors of the same resistance.

In operation 53, a first resistive device having a resistance of R1 is provided between the first input terminal and the second input terminal of the first operational amplifier.

In operation 54, a second resistive device having a resistance of R2 is provided between the second input terminal of the first operational amplifier and the output of the second operational amplifier. The first resistive device and the second resistive device function to reduce an original gain of the first operational amplifier by $$20 \log\left(\frac{R2}{R1} + 1\right) dB.$$

In some embodiments, the resistance R2 is N times the resistance R1, N being a positive integer.

In operation 55, a combined gain of the first operational amplifier is determined by measuring voltage levels at the outputs of the first operational amplifier and the second operational amplifier. The combined gain is composed of the original gain of the first operational amplifier and the reduced gain $$20 \log\left(\frac{R2}{R1} + 1\right) dB.$$

In operation 56, the original gain of the first operational amplifier is determined by adding the reduced gain $$20 \log\left(\frac{R2}{R1} + 1\right)$$

and the combined gain.

Figure 6:
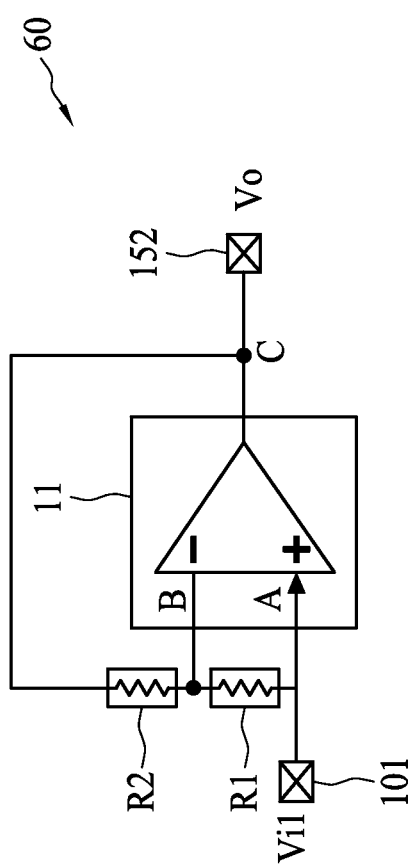
FIG. 6 is a diagram of a circuit for testing an operational amplifier, in accordance with some embodiments.

FIG. 6 is a diagram of a circuit 60 for testing an operational amplifier, in accordance with some embodiments. Referring to FIG. 6, circuit 60 includes first operational amplifier 11, first resistive device R1 and second resistive device R2, which have been discussed and illustrated with reference to FIG. 1. With first resistive device R1 and second resistive device R2, the differential input voltage (ΔVi) between first input terminal A and second input terminal B of first operational amplifier 11 can be determined under a relatively low testing resolution, for example, equal to or greater than 1 mV.

To measure ΔVi of first operational amplifier 11, in some existing testing approaches, in the absence of resistive devices R1 and R2, an input voltage Vi1 of 0.5V, for example, is applied to pad 101. Then the magnitude of an output voltage Vo at pad 152 is measured. The differential input voltage (ΔVi) is determined by the difference between Vi1 and Vo. In the case of a tester resolution of greater than 1 mV, such testing approaches may be ineffective as ΔVi is more often than not smaller than 1 mV.

In circuit 60, the voltage level Vo at pad 152 can be expressed in an equation below.

$$Vo = Vi1 + \Delta Vi + \Delta Vi \times \left(\frac{R2}{R1}\right) = Vi1 + \Delta Vi \times \left(\frac{R2}{R1} + 1\right)$$

Accordingly, ΔVi is determined as follows.

$$\Delta Vi = \frac{Vo - Vi1}{\left(\frac{R2}{R1} + 1\right)}$$

In some embodiments, to facilitate measurement, the ratio of $$\frac{R2}{R1}$$

is a positive integer N. Accordingly, ΔVi can be rewritten below.

$$\Delta Vi = \frac{Vo - Vi1}{(N+1)}$$

In an embodiment according to the present disclosure, N is set to 9. As a result, the difference between input voltage Vi1 and output voltage Vo is ten times the value of ΔVi, which facilitates the measurement of ΔVi by a tester having a relatively low resolution. For example, a tester having a resolution of 2 mV can now measure ΔVi of up to 0.2 mV, which would otherwise be out of the tester's gauge. Moreover, N in other embodiments may be set to 99. In that case, the same tester can now measure ΔVi of up to 0.02 mV.

Accordingly, embodiments of the present disclosure provide a circuit for measuring the differential input voltage ΔVi of an operational amplifier. Circuit 60 includes operational amplifier 11 having a first input terminal A and a second input terminal B, a first resistive device coupled between first input terminal A and the second input terminal B of operational amplifier 11, and a second resistive device coupled between the second input terminal B and an output 152 of operational amplifier 11. The first resistive device and the second resistive device contribute to enlarge the difference between an input voltage Vi1 at the first input terminal A and an output voltage Vo at the output 152 so as to facilitate the measurement of ΔVi of operational amplifier 11.

Embodiments of the present disclosure provide a circuit for measuring the gain of an operational amplifier is provided. The circuit comprises a first operational amplifier, a first resistive device and a second resistive device. The first operational amplifier has an original gain and includes a first input terminal and a second input terminal. The first resistive device is coupled between the first input terminal and the second input terminal of the first operational amplifier. The second resistive device is coupled to the second input terminal of the first operational amplifier. The first resistive device and the second resistive device are configured to reduce a predetermined amount of gain from the original gain of the first operational amplifier.

In an embodiment, the first resistive device has a resistance of R1 and the second resistive device has a resistance of R2. Moreover, the predetermined amount of gain is $$20\,\log\left(\frac{R2}{R1}+1\right)\,dB.$$

In another embodiment, the resistance R2 is N times the resistance R1, N being a positive integer.

In yet another embodiment, the circuit further comprises a second operational amplifier, which includes a first input terminal and an output. The first input terminal of the second operational amplifier is coupled to an output of the first operational amplifier. Moreover, the second resistive device is coupled between the second input terminal of the first operational amplifier and the output of the second operational amplifier.

In still another embodiment, the output of the second operational amplifier is coupled to a voltage division circuit.

In yet still another embodiment, the voltage division circuit includes a third resistive device and a fourth resistive device. The second operational amplifier includes a second input terminal coupled to a tap between the third resistive device and the fourth resistive device.

Some embodiments of the present disclosure provide a test structure for testing operational amplifiers in an unpackaged semiconductor wafer. The test structure comprises a first circuit and a second circuit. The first circuit includes a first operational amplifier having a first gain, and a resistive device coupled with the first operational amplifier and configured to reduce a predetermined amount of gain from the first gain. The second circuit includes a second operational amplifier having a second gain, and a resistive device coupled with the second operational amplifier and configured to reduce a predetermined amount of gain from the second gain.

In an embodiment, the resistive device of the first circuit includes a first resistor coupled between a first input terminal and a second input terminal of the first operational amplifier, and a second resistor coupled to the second input terminal of the first operational amplifier.

In another embodiment, in the first circuit the first resistor has a resistance of R1 and the second resistor has a resistance of R2, and the predetermined amount of gain is $$20\,\log\left(\frac{R2}{R1}+1\right)\,dB.$$

Moreover, the resistance R2 is N times the resistance R1, N being a positive integer.

In yet another embodiment, the resistive device of the second circuit includes a first resistor coupled between a first input terminal and a second input terminal of the second operational amplifier, and a second resistor coupled to the second input terminal of the second operational amplifier.

In still another embodiment, in the second circuit the first resistor has a resistance of R3 and the second resistor has a resistance of R4, and the predetermined amount of gain is $$20\,\log\left(\frac{R4}{R3}+1\right)\,dB.$$

Moreover, the resistance R4 is M times the resistance R3, M being a positive integer. In yet still another embodiment, M is different from N.

Embodiments of the present disclosure provide a method of measuring the gain of an operational amplifier. The method comprises providing a first operational amplifier having an original gain, providing a resistive device coupled with the first operational amplifier, the resistive device being configured to reduce a predetermined amount of gain from the original gain of the first operational amplifier, measuring a combined gain of the first operational amplifier in conjunction with the resistive device, and determining the original gain of the first operational amplifier by adding the reduced gain to the combined gain.

In an embodiment, the resistive device includes a first resistor coupled between a first input terminal and a second input terminal of the first operational amplifier, and a second resistor coupled to the second input terminal of the first operational amplifier.

In another embodiment, the method further comprises providing a second operational amplifier including an input terminal and an output. The input terminal of the second operational amplifier is coupled to an output of the first operational amplifier. Moreover, the second resistor is coupled between the second input terminal of the first operational amplifier and the output of the second operational amplifier.

The above description includes exemplary operations, but these operations are not necessarily required to be performed in the order shown. Operations may be added, replaced, changed order, skipped, and/or eliminated as appropriate, in accordance with the spirit and scope of the disclosure. Accordingly, the scope of the disclosure should be determined with reference to the following claims, along with the full scope of equivalences to which such claims are entitled.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit for measuring the gain of an operational amplifier, the circuit comprising:
   a first operational amplifier having an original gain and including a first input terminal and a second input terminal;
   a first resistive device directly coupled between the first input terminal and the second input terminal of the first operational amplifier;
   a second resistive device coupled to the second input terminal of the first operational amplifier, the first resistive device and the second resistive device being configured to reduce a predetermined amount of gain from the original gain of the first operational amplifier; and
   a second operational amplifier including a first input terminal and an output, the first input terminal of the second operational amplifier being coupled to an output of the first operational amplifier, wherein the second resistive device is coupled between the second input terminal of the first operational amplifier and the output of the second operational amplifier,
   wherein the output of the second operational amplifier is coupled to a voltage division circuit,
   wherein the voltage division circuit includes a third resistive device and a fourth resistive device, and the second operational amplifier includes a second input terminal coupled to a tap between the third resistive device and the fourth resistive device.

2. The circuit of claim 1, wherein the first resistive device has a resistance of R1 and the second resistive device has a resistance of R2, and the predetermined amount of gain is $$20 \log\left(\frac{R2}{R1} + 1\right) \text{ dB}.$$

3. The circuit of claim 2, wherein the resistance R2 is N times the resistance R1, N being a positive integer.

4. A test structure for testing operational amplifiers in an unpackaged semiconductor wafer, the test structure comprising:
   a first circuit comprising:
      a first operational amplifier having a first gain; and
      a resistive device coupled with the first operational amplifier and configured to reduce a predetermined amount of gain from the first gain, wherein the resistive device of the first circuit includes a first resistor directly coupled between a first input terminal and a second input terminal of the first operational amplifier;
   a second circuit comprising:
      a second operational amplifier having a second gain; and
      a resistive device coupled with the second operational amplifier and configured to reduce a predetermined amount of gain from the second gain,
      wherein the resistive device of the first circuit further includes a second resistor coupled to the second input terminal of the first operational amplifier; and
      a third operational amplifier including an input terminal and an output, the input terminal of the third operational amplifier being coupled to an output of the first operational amplifier, wherein the second resistor is coupled between the second input terminal of the first operational amplifier and the output of the third operational amplifier.

5. The test structure of claim 4, wherein in the first circuit the first resistor has a resistance of R1 and the second resistor has a resistance of R2, and the predetermined amount of gain is $$20 \log\left(\frac{R4}{R3} + 1\right) \text{ dB}.$$

6. The test structure of claim 5, wherein the resistance R2 is N times the resistance R1, N being a positive integer.

7. The test structure of claim 4, wherein the resistive device of the second circuit includes a first resistor coupled between a first input terminal and a second input terminal of the second operational amplifier, and a second resistor coupled to the second input terminal of the second operational amplifier.

8. The test structure of claim 7, wherein in the second circuit the first resistor has a resistance of R3 and the second resistor has a resistance of R4, and the predetermined amount of gain is $$20 \log\left(\frac{R2}{R1} + 1\right) \text{ dB}.$$

9. The test structure of claim 8, wherein the resistance R4 is M times the resistance R3, M being a positive integer.

10. The test structure of claim 7 further comprising a fourth operational amplifier including an input terminal and an output, the input terminal of the fourth operational amplifier being coupled to an output of the second operational amplifier, wherein the second resistor is coupled between the second input terminal of the second operational amplifier and the output of the fourth operational amplifier.

11. A method of measuring the gain of an operational amplifier, the method comprising:
   providing a first operational amplifier having an original gain;
   providing a resistive device coupled with the first operational amplifier, the resistive device being configured to reduce a predetermined amount of gain from the original gain of the first operational amplifier, wherein the resistive device includes a first resistor directly coupled between a first input terminal and a second input terminal of the first operational amplifier, and a second resistor coupled to the second input terminal of the first operational amplifier;

providing a second operational amplifier including a first input terminal, a second input terminal and an output, the first input terminal of the second operational amplifier being coupled to an output of the first operational amplifier, wherein the second resistor is coupled between the second input terminal of the first operational amplifier and the output of the second operational amplifier;

providing a voltage division circuit, wherein the output of the second operational amplifier is coupled to the voltage division circuit, wherein the voltage division circuit includes a third resistive device and a fourth resistive device, wherein the second input terminal of the second operational amplifier is coupled to a tap between the third resistive device and the fourth resistive device;

measuring a combined gain of the first operational amplifier in conjunction with the resistive device; and determining the original gain of the first operational amplifier by adding the reduced gain to the combined gain.

12. The method of claim 11, wherein the first resistor has a resistance of R1 and the second resistor has a resistance of R2, and the predetermined amount of gain is $$20 \log\left(\frac{R2}{R1} + 1\right) dB.$$

13. The method of claim 12, wherein the resistance R2 is N times the resistance R1, N being a positive integer.

* * * * *